(12) United States Patent
Nakagawa et al.

(10) Patent No.: US 7,188,735 B2
(45) Date of Patent: Mar. 13, 2007

(54) RACK STRUCTURE BODY FOR MACHINE

(75) Inventors: Yoshihisa Nakagawa, Kawasaki (JP); Hideki Sonobe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 477 days.

(21) Appl. No.: 10/766,657

(22) Filed: Jan. 27, 2004

(65) Prior Publication Data

US 2004/0188363 A1 Sep. 30, 2004

(30) Foreign Application Priority Data

Mar. 25, 2003 (JP) .............................. 2003-083474

(51) Int. Cl.
*A47F 7/00* (2006.01)
(52) U.S. Cl. ..................................................... 211/26
(58) Field of Classification Search ................. 211/26, 211/189, 72, 126.16, 182; 292/169; 312/265.1, 312/265.4; 49/193
See application file for complete search history.

(56) References Cited

U.S. PATENT DOCUMENTS

| | | | | |
|---|---|---|---|---|
| 4,715,502 A | * | 12/1987 | Salmon | 211/26 |
| 5,749,476 A | * | 5/1998 | Besserer et al. | 211/26 |
| 6,223,908 B1 | * | 5/2001 | Kurtsman | 211/26 |
| 6,814,244 B1 | * | 11/2004 | Hathcock | 211/26 |

FOREIGN PATENT DOCUMENTS

| | | |
|---|---|---|
| CN | 2 349 723 | 11/1999 |
| CN | 2 434 829 | 6/2001 |
| JP | 55-91186 | 6/1980 |
| JP | 3028943 | 7/1996 |
| JP | 9-240721 | 9/1997 |

* cited by examiner

*Primary Examiner*—Sarah Purol
(74) *Attorney, Agent, or Firm*—Katten Muchin Rosenman LLP

(57) ABSTRACT

A rack structure body for a machine includes a frame body provided at one of a front surface side and a back surface side of the rack structure body. The frame body includes a main frame part formed by bending and a sub frame part formed by bending. The sub frame part is installed inside of the main frame part. The frame body has a hollow structure.

10 Claims, 13 Drawing Sheets

FIG.2 RELATED ART
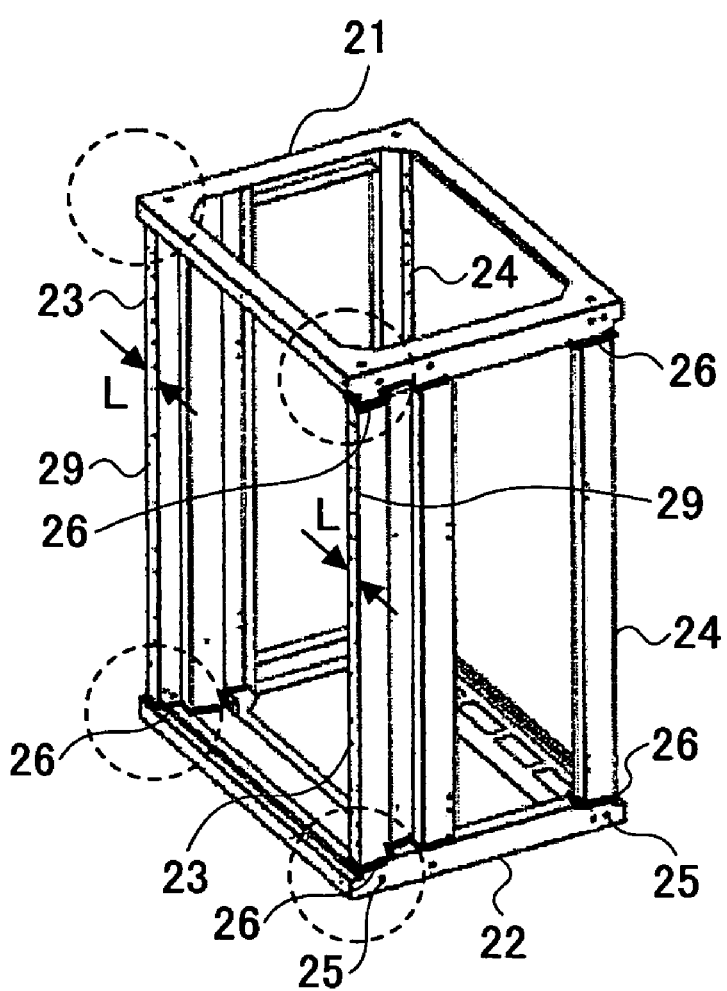
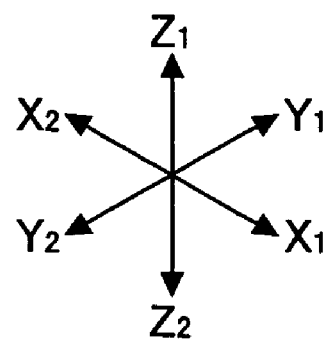

FIG.4 RELATED ART
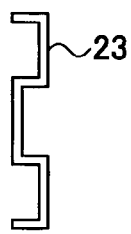
FIG.5
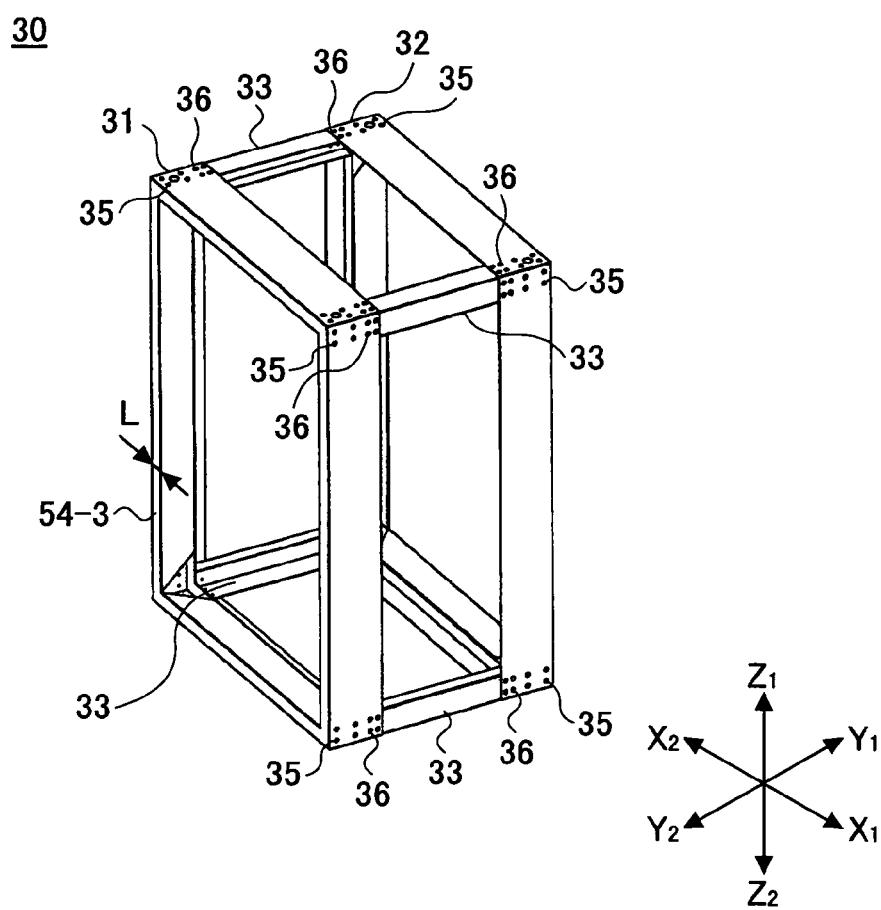

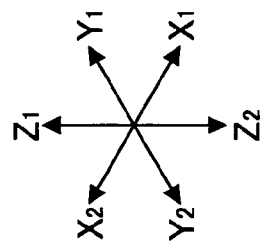
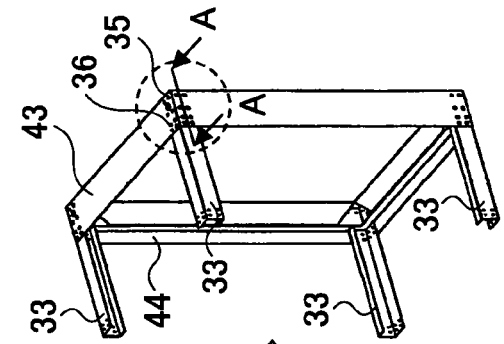
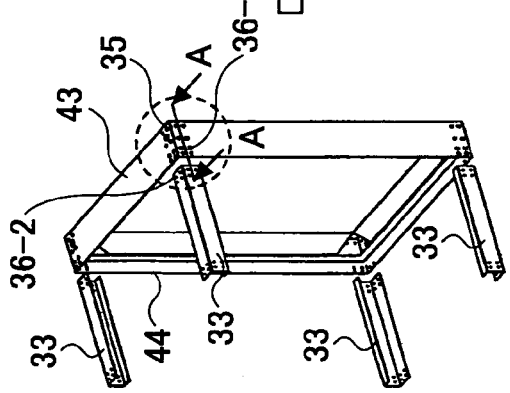
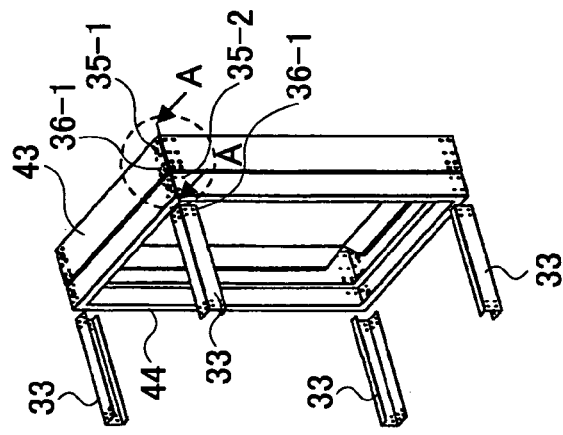

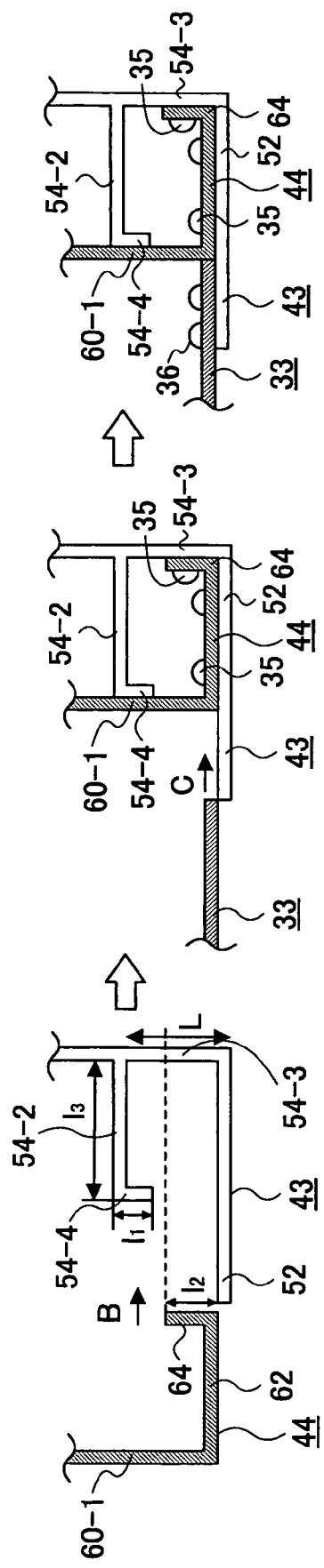

FIG.13
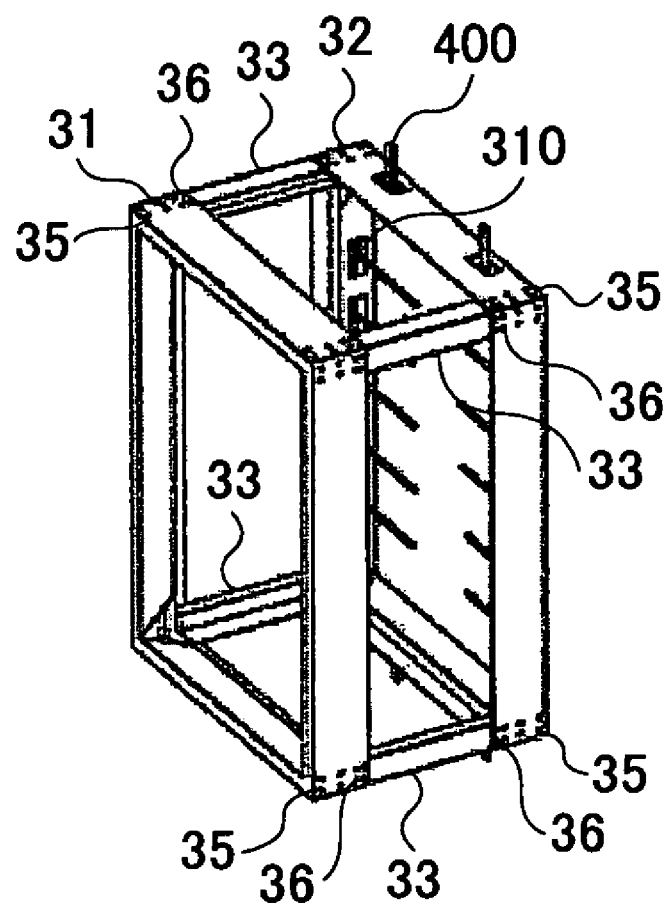
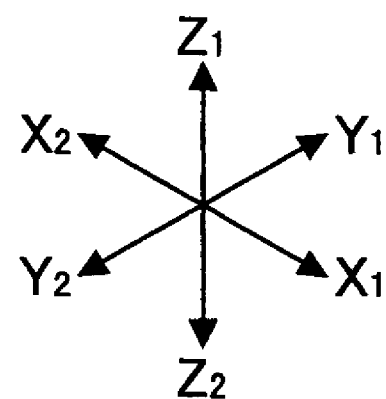

RACK STRUCTURE BODY FOR MACHINE

BACKGROUND OF THE INVENTION

1. Field of the Invention

The present invention generally relates to rack structure bodies for machines, and more particularly, to a rack structure body on which an electronic machine is mounted, for example.

2. Description of the Related Art

Generally, a communication apparatus, an electronic machine such as a computer, a calculating machine, or the like; an apparatus for supplying electric power to the communication apparatus and the electronic machine (for example, an electric power supply apparatus where a battery for arc welding is installed), or the like is installed in a rack structure body consisting of various frames and racks. Recently and continuing, there is a tendency that parts forming the above mentioned electronic machine or electric power supply apparatus are installed in the machine or apparatus with high density, so that the machine or the apparatus is heavy.

FIG. 1 is an exploded perspective view showing a structure of a related art communication apparatus.

Referring to FIG. 1, a related art communication apparatus 10 has a structure wherein a plurality of shelves 12 are provided in a rack structure body 11. A lot of units 13, comprising electronic circuit boards or the like on which electronic parts are provided at high density, are inserted into the shelves 12. The rack structure body 11 includes a ceiling part frame body 21, a floor part frame body 22, two pieces of front surface side frame bodies 23, two pieces of back surface side frame bodies 24, and the like.

The whole weight of the communication apparatus 10, including the shelves 12 and the rack structure body 11, is supported by the rack structure body 11. The shelf 12 is installed at the front surface side frame body 23 so as to be provided inside of the rack structure body 11. Reinforcement members 14 are installed in the rack structure body 11 so as to reinforce the rack structure body 11.

FIG. 2 is a perspective view showing a structure of the rack structure body 11 shown in FIG. 1. FIG. 3 is an exploded perspective view showing the structure of the rack structure body 11 shown in FIG. 1. FIG. 4 is a cross-sectional view taken along the line A—A shown in FIG. 3.

Referring to FIG. 2 and FIG. 3, the ceiling part frame body 21 and the floor part frame body 22 have roughly rectangular and hollow configurations in the $Z_1$–$Z_2$ direction. The ceiling part frame body 21 and the floor part frame body 22 are provided so as to face each other. Two pieces of the front surface side frame bodies 23 are fit into two corner parts of front surface sides ($Y_2$ side) of the ceiling part frame body 21 and the floor part frame body 22 in the $Z_1$–$Z_2$ direction. Two pieces of the back surface side frame bodies 24 are fit into two corner parts of back surface sides ($Y_1$ side) of the ceiling part frame body 21 and the floor part frame body 22 in the $Z_1$–$Z_2$ direction.

The front surface side frame body 23 and the back surface side frame body 24 have substantially equal lengths in the $Z_1$–$Z_2$ direction. However, the front surface side frame body 23 and the back surface side frame body 24 are different in the following features. That is, referring to FIG. 4, the front surface side frame body 23 has a cross-sectional configuration in the X-Y plane in that continuous concave and convex parts are seen from inside parts of the ceiling part frame body 21 and the floor part frame body 22. The concave and convex parts are formed by bending. On the other hand, the back surface side frame body 24 has a cross-sectional configuration in the X-Y plane in that a side facing the inside of the ceiling part frame body 21 and the floor part frame body 22 is opened so as to form a "]" shaped configuration.

Furthermore, referring back to FIG. 2 and FIG. 3, a plurality of installation hole parts 29 are formed at the front surface side ($Y_2$ side) of the front surface side frame body 23 in the $Z_1$–$Z_2$ direction. The installation hole parts 29 are used for installing the shelf 12 into the inside of the rack structure body 11 by screws or the like.

The above mentioned rack structure body 11 is assembled as follows. That is, first of all, two of the front surface side frame bodies 23 and two of back surface side frame bodies 24 are provided between the ceiling part frame body 21 and the floor part frame body 22. Next, the ceiling part frame body 21 and the two front surface side frame bodies 23, the ceiling part frame body 21 and the two back surface side frame bodies 24, the floor part frame body 22 and the two front surface side frame bodies 23, and the floor part frame body, 22 and the two back surface side frame bodies 24 are respectively positioned by a plurality of rivets 25, so that pre-assembling is done.

After that, as shown in FIG. 2, welding is performed at the whole circumferences (shown by numerical reference 26 in FIG. 2) of surfaces, where the ceiling part frame body 21 and the floor part frame body 22 face and the front surface side frame bodies 23 and the back surface side frame bodies 24 are connected, so that the rack structure body 11 is assembled.

Furthermore, welding is also performed in the $Z_1$–$Z_2$ direction at a part (shown by numerical reference 27 in FIG. 3), where surfaces in the X-Z and Y-Z planes of the ceiling part frame body 21 and the floor part frame body 22 come in contact with each other so that strengths of the ceiling part frame body 21 and the floor part frame body 22 can be improved.

According to other related art, there is a rack including a side surface board by which a pair of front and rear rectangular frames are connected.

According to further other related art, there is a casing body having a structure wherein a pair of vertical frames made of metal plates are connected by horizontal plates.

However, according to the rack structure body 11 of the above mentioned related art communication apparatus 10, it may be difficult to sufficiently correspond to the heavy weight of the communication apparatus 10 based on the heavy weight of the parts that are provided in the communication apparatus 10 with high density.

That is, if the width of the front surface side frame bodies 23 or the back surface side frame bodies 24 is increased or reinforcement metal fittings are further provided so as to improve the structural strength of the rack structure body 11 for corresponding to the heavy weight of the communication apparatus 10, the weight of the rack structure body 11 is increased.

For example, since the shelf 13 shown in FIG. 1 is inserted from the front surface side of the communication apparatus 10 to the back side surface side of the communication apparatus 10, namely from the $Y_2$ side to the $Y_1$ side so as be provided in the communication apparatus 10, stress is concentrated at the front surface side, namely the $Y_2$ side. If the width of the front surface side frame bodies 23 is made greater in order to solve the above mentioned problem, the weight of the rack structure body 11 is increased.

Meanwhile, an allowable floor load, that is an allowable value of a floor load applied by the rack structure body 11, for example approximately 300 [kg], is prescribed for the floor part where the rack structure body 11 is provided. In a case where the load exceeds the above mentioned allowable floor load, it may be impossible to provide the rack structure body 11 on the floor part.

Furthermore, in a case where the weight of the rack structure body 11 is increased without strengthening the rack structure body 11, if some external force is applied so that vibration of the frame structure body 11 occurs, displacement value in the $X_1$–$X_2$ direction of FIG. 2 is made large, for example.

If the displacement occurs so that the displacement value exceeds an allowable displacement standard value (for example, approximately 50 [mm]), the rack structure body 11 may come in contact with other apparatuses which stand close to the rack structure body 11. Furthermore, if the applied stress exceeds allowable stress of materials for the rack structure body 11, the rack structure body 11 may be broken.

Furthermore, if the weight of the rack structure body 11 is increased, a characteristic frequency of the rack structure body 11 is made small and may be lower than a designated characteristic frequency, for example approximately 7[Hz]. As a result of this, the characteristic frequency of the rack structure body 11 may agree with an earthquake wave frequency ingredient having a value less than approximately 10 [Hz] or 7 [Hz], so that the communication apparatus 10 is resonated and therefore resistance to earthquakes of the communication apparatus 10 may be degraded.

Meanwhile, it is necessary to secure sufficient space to provide for the shelf 12 shown in FIG. 1. Hence, it is ideal that the frontage of the rack structure body 11, namely the space between two of the front surface side frame bodies 23 which face each other be made large; and width L, namely the length in the $X_1$–$X_2$ direction of the front surface side frame bodies 23 will thereby be shortened.

However, in the related art rack structure body 11 shown in FIG. 1 through FIG. 3, if the width L, namely the length in the $X_1$–$X_2$ direction of the front surface side frame bodies 23 is shortened, the strength of the rack structure body 11 is made low. Structural opposing means against displacement in the $X_1$–$X_2$ direction of the rack structure body 11 are mainly the ceiling part frame body 21 and the floor part frame body 22. Hence, if the width L, namely the length in the $X_1$–$X_2$ direction of the front surface side frame bodies 23 is shortened, the strength in the $X_1$–$X_2$ direction of the rack structure body 11 is lowered so that the amount of the displacement in the $X_1$–$X_2$ direction is made large due to vibration and others. Under the above mentioned structure, stress concentrates at a part where the ceiling part frame body 21, the floor part frame body 22, and the front surface side frame bodies 23 come in contact and welding is performed, namely the part circled by a dotted line and shown by numerical reference 26 in FIG. 2.

Furthermore, if the above mentioned welding is performed, heat stress or the like due to the welding occurs. This causes a decrease of the measurement precision of the positions of the installation hole parts 29 formed at the front surface side ($Y_2$ side) of the front surface side frame body 23, namely assembling measurement precision of the rack structure body 11. Furthermore, this requires skill and experience for assembling the rack structure body 11, takes a lot of time for assembling, and causes an increase of manufacturing cost.

In addition, since electrical wiring having a designated length is used for the communication apparatus 10, it is necessary to secure space at the rack structure body where the electrical wiring can be provided.

SUMMARY OF THE INVENTION

Accordingly, it is a general object of the present invention to provide a novel and useful rack structure body for a machine in which one or more of the problems described above are eliminated.

Another and more specific object of the present invention is to provide a rack structure body having high strength and light weight so as to endure the heavy weight of a machine due to parts being provided in the machine at high density.

The above objects of the present invention are achieved by a rack structure body for a machine, including a frame body provided at one of a front surface side and a back surface side of the rack structure body, wherein the frame body includes a main frame part formed by bending and a sub frame part formed by bending, the sub frame part is installed inside of the main frame part, and the frame body has a hollow structure.

According to the present invention as described above, it is possible to provide a rack structure body with a high strength and light weight so as to endure the heavy weight of the machine due to the parts being provided in the machine with high density.

Other objects, features, and advantages of the present invention will become more apparent from the following detailed description when read in conjunction with the accompanying drawings.

BRIEF DESCRIPTION OF THE DRAWINGS

FIG. 2 is a perspective view showing a structure of the rack structure body 11 shown in FIG. 1;

FIG. 4 is a cross-sectional view taken along the line A—A shown in FIG. 3;

FIG. 5 is a perspective view of a rack structure body 30 of a first embodiment of the present invention;

FIG. 11 is a view for explaining assembling steps of the rack structure body 30;

FIG. 12 is a cross-sectional view of a part circled by a dotted line and taken along a line A-A shown in FIG. 11;

FIG. 13 is a perspective view of the rack structure body 300 of the first embodiment of the present invention.

DETAILED DESCRIPTION OF THE PREFERRED EMBODIMENTS

A description is next given, with reference to the drawings, of embodiments of the present invention.

Figure 1:
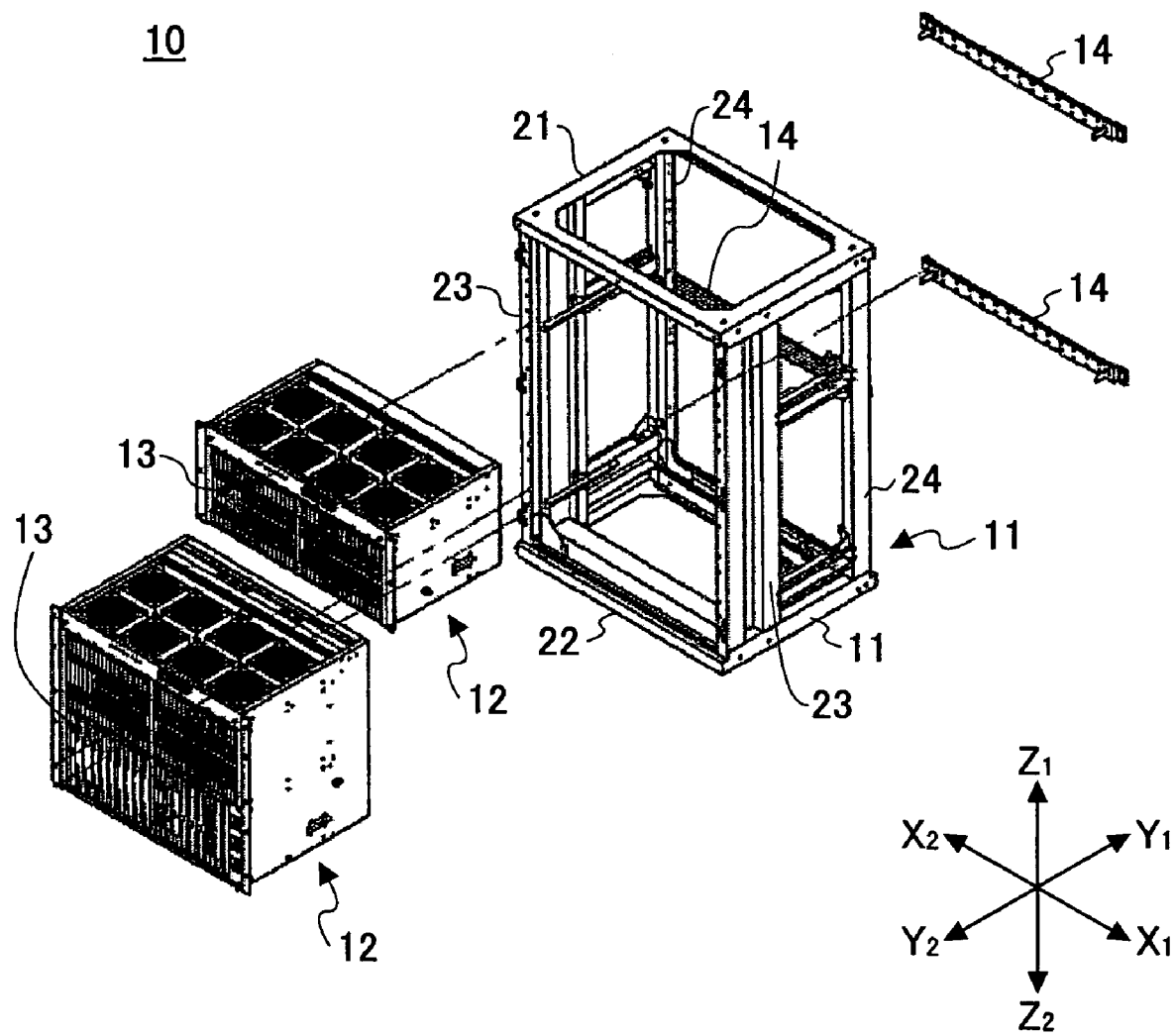
FIG. 1 is an exploded perspective view showing a structure of a related art communication apparatus.
Figure 3:
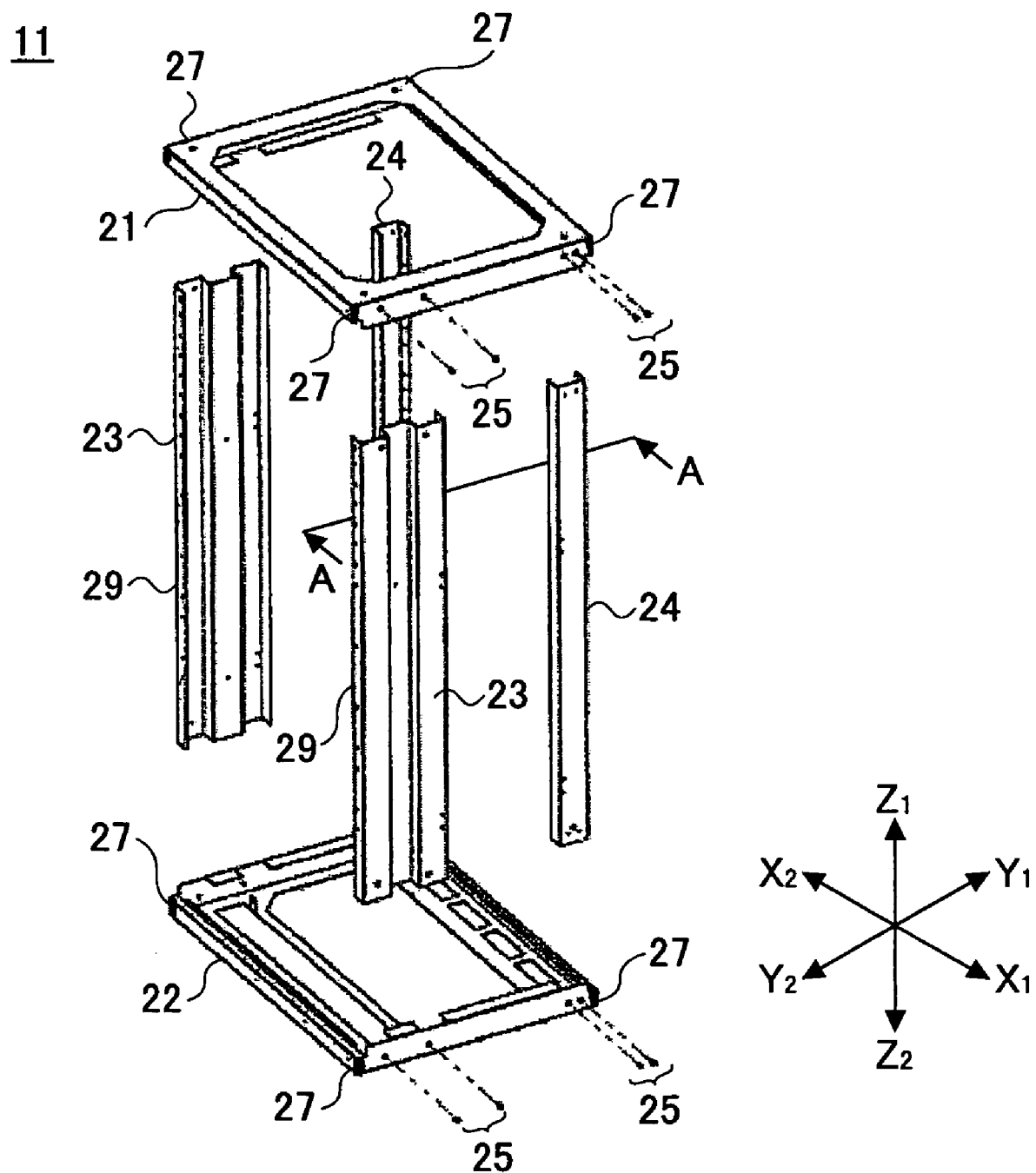
FIG. 3 is an exploded perspective view showing the structure of the rack structure body 11 shown in FIG. 1.
Figure 6:
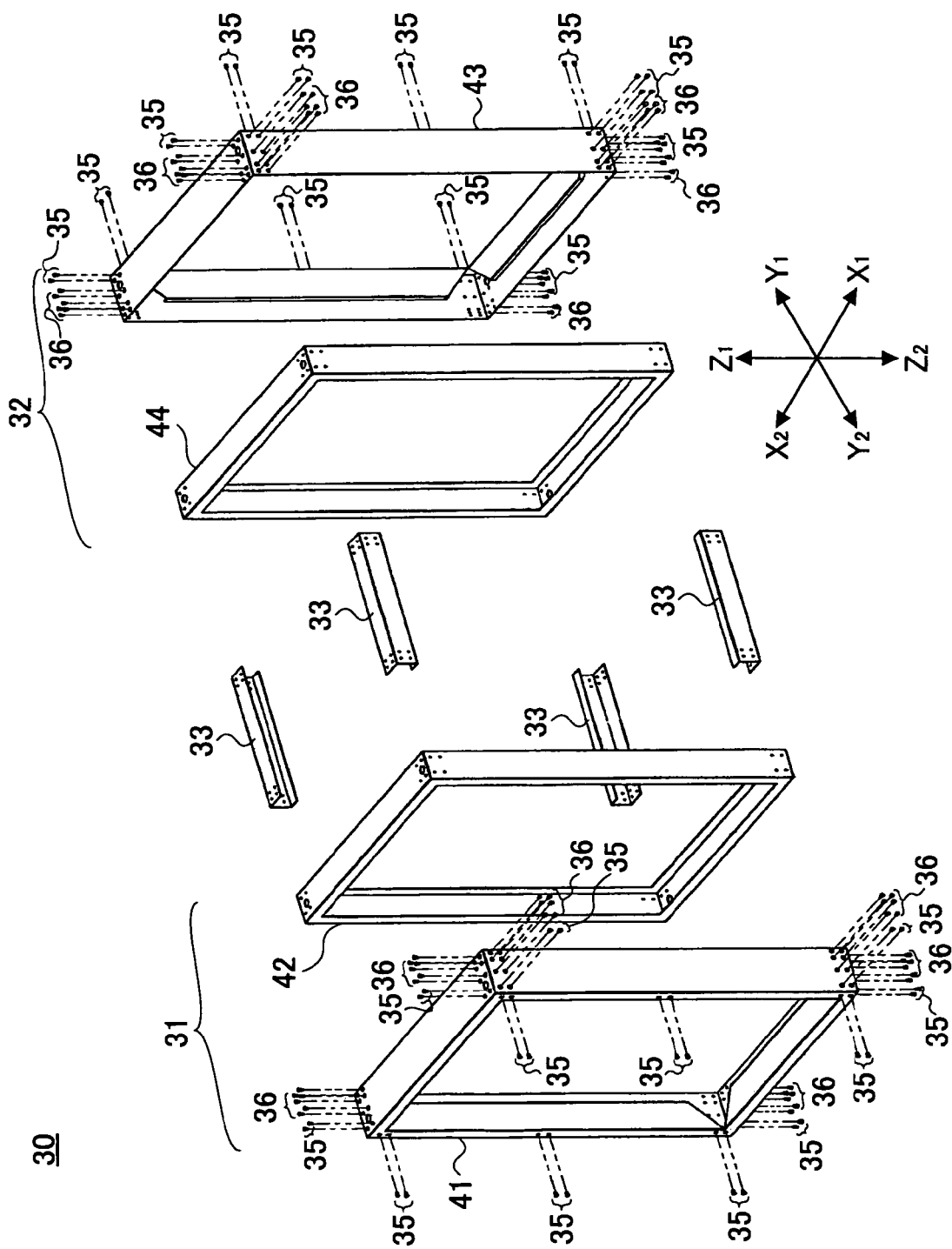
FIG. 6 is an exploded perspective view showing a structure of the rack structure body 30 shown in FIG. 5.

FIG. 5 is a perspective view of a rack structure body 30 of a first embodiment of the present invention. FIG. 6 is an exploded perspective view showing a structure of the rack structure body 30 shown in FIG. 5.

As shown in FIG. 5, the rack structure body 30 of the first embodiment of the present invention includes a front surface side frame part 31, a back surface side frame part 32, four frame body connection members 33, and others.

As shown in FIG. 6, the front surface side frame-part 31 includes a front surface side main frame part 41 and a front surface side sub frame part 42. The front surface side main frame part 41 forms an external form part of the front surface side frame part 31. The front surface side sub frame part 42 is installed inside of the front surface side main frame part 41 and reinforces and supports the front surface side main frame part 41. As described below, the front surface side main frame part 41 and the front surface side sub frame part 42 are integrally formed by bending with sheet metal press working.

The back surface side frame part 32 includes a back surface side main frame part 43 and a-back surface side sub frame part 44. The back surface side main frame part 43 forms an external form part of the back surface side frame part 32. The back surface side sub frame part 44 is installed inside of the back surface side main frame part 43 and reinforces and supports the back surface side main frame part 43. As described below, the back surface side main frame part 43 and the back surface side sub frame part 44 are integrally formed by bending with-sheet metal press working.

Referring to both FIG. 5 and FIG. 6, the front surface side frame part 31 and the back surface side frame part 32 are provided so as to face each other. The front surface side frame part 31 and the back surface side frame part 32 are connected by four frame body connection members 33. The frame body connection members 33 have substantially the same length in the $Y_1$–$Y_2$ direction. More specifically, the frame body connection members 33 are installed at two corners of a ceiling side ($Z_1$ side) and at two corners of a floor side ($Z_2$ side) of the front surface side frame part 31 and the back surface side frame part 32, in the $Y_1$–$Y_2$ direction.

Each of the respective frame body connection members 33 has a cross sectional configuration in the X-Z plane so that a side facing the other frame body connection member 33 in the $X_1$–$X_2$ direction opens, so as to form a "]" shaped configuration. The four frame body connection members 33 have substantially the same structures. The frame body connection members 33 are integrally formed by bending with sheet metal press working. A plurality of second rivet installing hole forming parts 36-2 are formed at a surface where the frame body connection members 33 come in contact with the front surface side frame part 31 and the back surface side frame part 32. The second rivets 36 are fit-inserted to the second rivet installing hole forming parts 36-2.

The front surface side sub frame part 42 fitted in the front surface side main frame part 41 is fixed to the front surface side main frame part 41 by the first rivets 35. The back surface side sub frame part 44 fitted in the back surface side main frame part 43 is fixed to the back surface side main frame part 43 by the first rivets 35. The frame body connection members 33 are fixed to the front surface side main frame part 41 and the back surface side main frame part 43 by the second rivets 36.

Next, structures of the front surface side main frame part 41 (the back surface side main frame part 43) and the front surface side sub frame part 42 (the back surface side sub frame part 44) which are integrally formed by bending with sheet metal press working, are explained. Meanwhile, the back surface side frame body 32, the back surface side main frame part 43, and the back surface side sub frame part 44 respectively have the same structures as the front surface side frame body 31, the front surface side main frame part 41, and the front surface side sub frame part 42. Hence, in the following, fundamentally, explanation of the front surface side frame body 31, the front surface side main frame part 41, and the front surface side sub frame part 42 substitutes for explanation of the back surface side frame body 32, the back surface side main frame part 43, and the back surface side sub frame part 44.

First of all, the front surface side main frame part 41 is explained.

Figure 7:
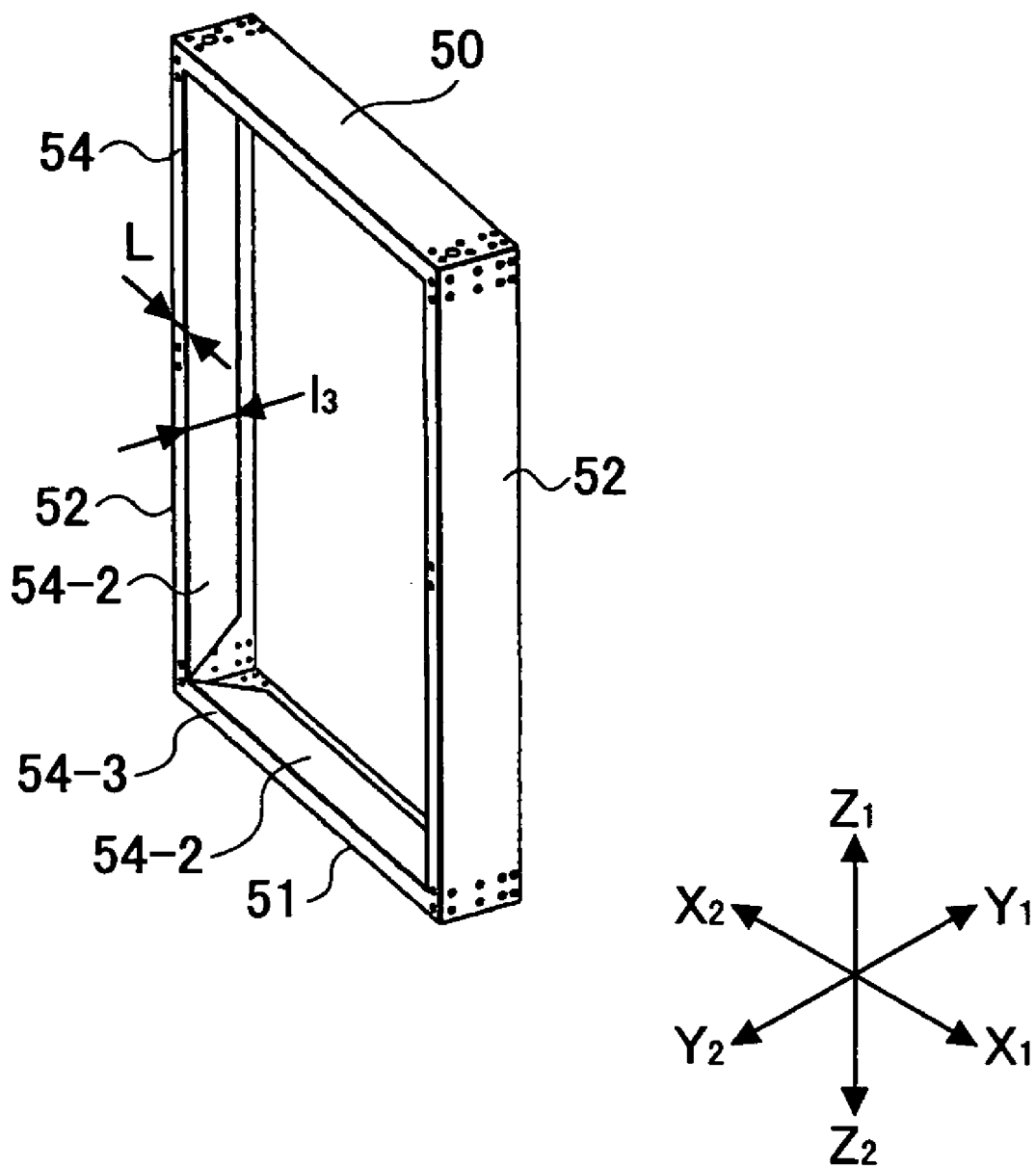
FIG. 7 is a perspective view of a front surface side main frame part 41 (a back surface side main frame part 43)
Figure 8:
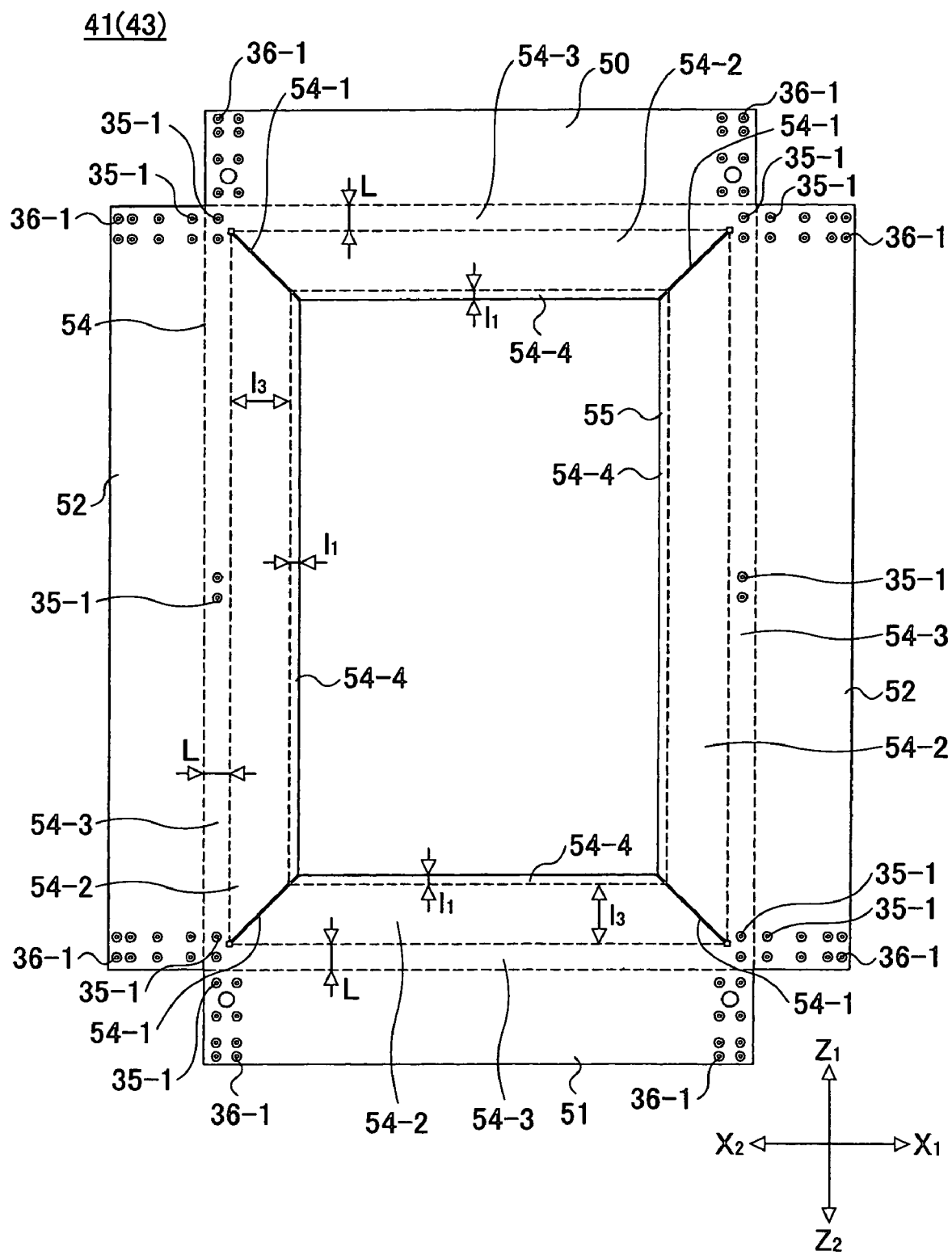
FIG. 8 is a development view of the front surface side main frame part 41 (the back surface side main frame part 43)

FIG. 7 is a perspective view of the front surface side main frame part 41 (the back surface side main frame part 43). FIG. 8 is a development view of the front surface side main frame part 41 (the back surface side main frame part 43). In the development view shown in FIG. 8, a part shown by a dotted line indicates a part which to be bent at substantially ninety degrees.

Referring to FIG. 8, the front surface side main frame part 41 is formed from a piece of plate having a substantially rectangular configuration by sheet metal press working. That is, the front surface side main frame part 41 is formed by cutting out four corner parts having substantially square configurations and located at the four corners of the plate; by cutting a part having a substantially rectangular configuration and situated at a substantially center part of the plate and so as to form a rectangular hole forming part 55, and by further bending the plate. More specifically, the front surface side main frame part 41 includes a ceiling part 50, a floor part 51, two of side surface parts 52, a front surface part 54, and others.

In FIG. 8, the ceiling part 50 and the floor part 51 are formed by bending at approximately 90 degrees from a state shown in FIG. 8. Similarly, the side surface parts 52 are also formed by bending at approximately 90 degrees from a state shown in FIG. 8.

As described above, the rectangular hole forming part 55 is provided at the substantially center of the front surface part 54. Four cuts having designated lengths are formed from the rectangular hole forming part 55 to the four corners of the front surface part 54, so that four cut forming parts 54-1 (shown in only FIG. 7) are formed. Four guide parts 54-2 are formed by bending at approximately 90 degrees, from lines formed by linking the end parts situated at the opposite side to the rectangular hole forming part 55 of the four cut forming parts 54-1, in X and Z directions. A width, that is a length in the $X_1$–$X_2$ direction of FIG. 8, of the guide part 54-2 is set as a length $l_3$. A circumference edge part 54-3 is provided at a front surface side (at the $Y_2$ side in FIG. 7) of the front surface side main frame part 41. The circumference edge part 54-3 has a width (a length in the $X_1$–$X_2$ direction of FIG. 7 and FIG. 8) having a length L.

A connection part 54-4 is formed by further bending at approximately 90 degrees of a part of a length $l_1$ alienated from the end part situated at the opposite side from the circumference edge part 54-3 of the guide part 54-2, so as to be parallel to the above mentioned circumference edge part 54-3.

A plurality of first rivet installing hole forming parts 35-1 are formed at vicinities of four corners of the circumference edge part 54-3 and parts near the above vicinities of the ceiling part 50, the floor part 51, and the side face parts 52. A plurality of the first rivets 35 shown in FIG. 6 can be fit-inserted to the first rivet installing hole forming parts 35-1. Similarly, a plurality of the first rivet installing hole forming parts 35-1 are formed at substantially center parts in a height direction ($Z_1$–$Z_2$ direction of FIG. 8) of the circumference edge part 54-3.

Furthermore, a plurality of the second rivet installing hole forming parts 36-1 are formed in the a vicinity of a corner part at a side where the first rivet installing hole forming parts 35-1 are formed, of the ceiling part 50, the floor part 51, and the side face parts 52. A plurality of the second rivets 36 shown in FIG. 6 can be fit-inserted to the second rivet installing hole forming parts 36-1.

Next, the front surface side sub frame part 42 is explained.

Figure 9:
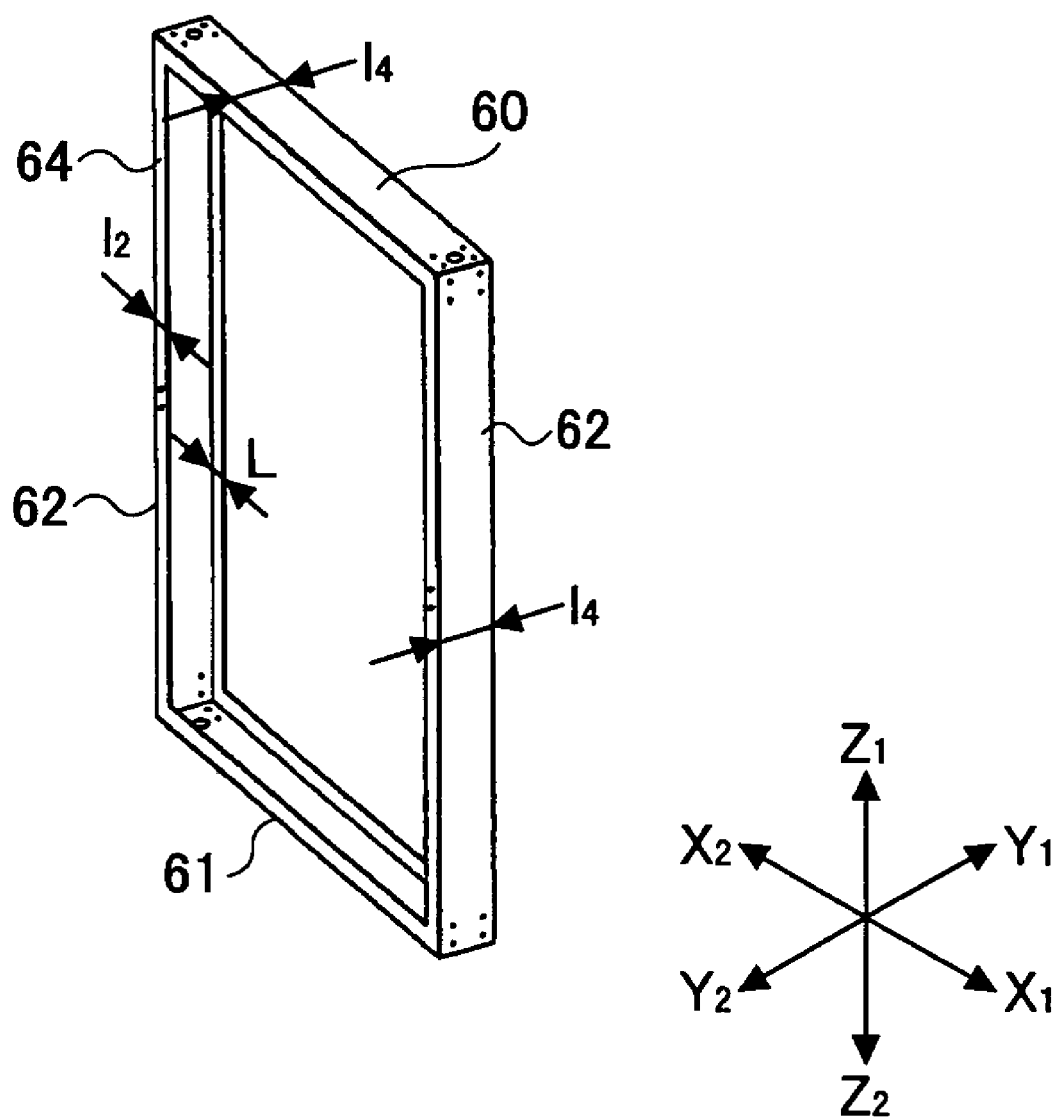
FIG. 9 is a perspective view of a front surface side sub frame part 42 (a back surface side sub frame part 44)
Figure 10:
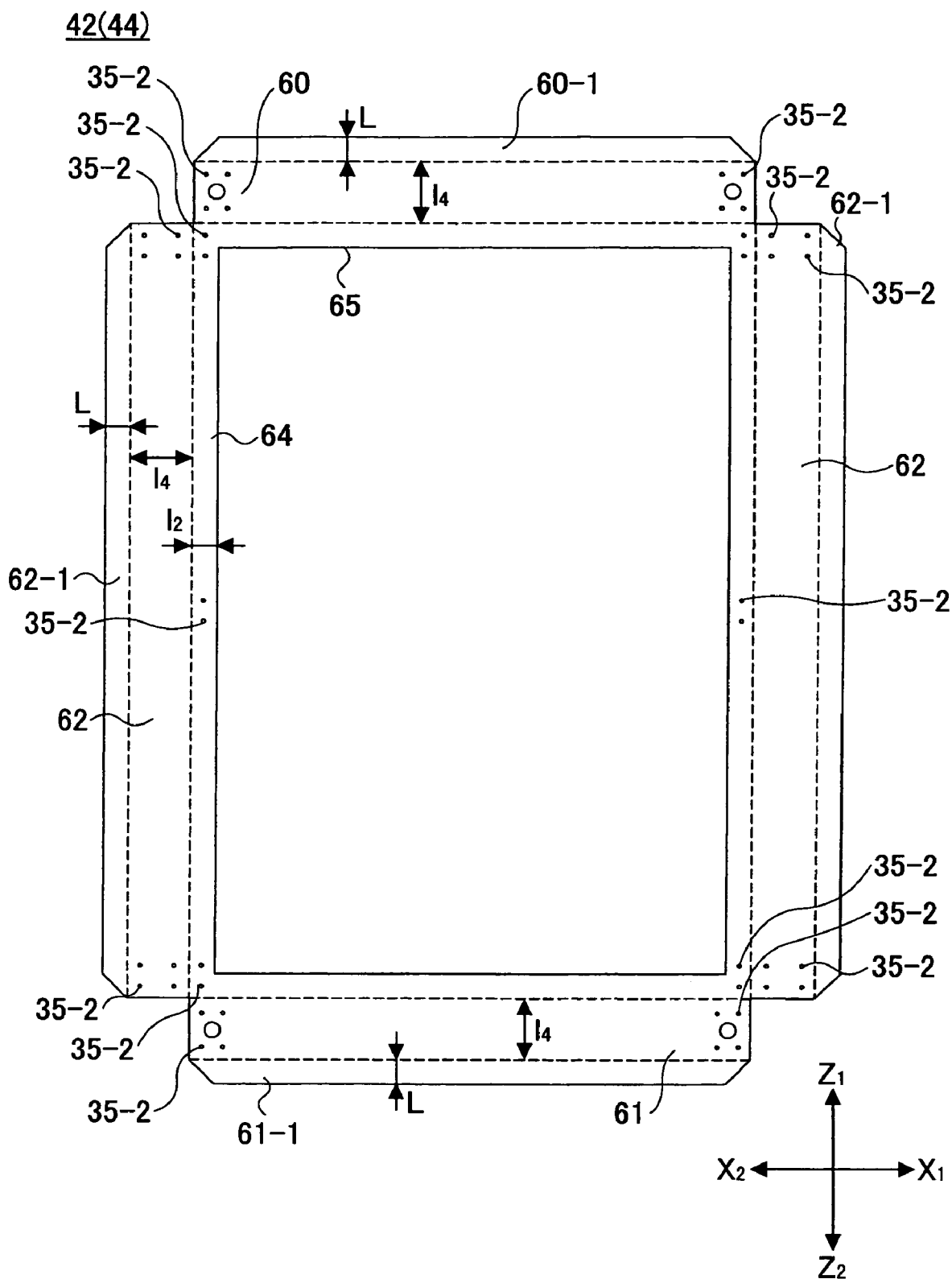
FIG. 10 is a development view of the front surface side sub frame part 42 (the back surface side sub frame part 43)

FIG. 9 is a perspective view of the front surface side sub frame part 42 (a back surface side sub frame part 44). FIG. 10 is a development view of the front surface side sub frame part 42 (the back surface side sub frame part 43). In the development view shown in FIG. 10, a part shown by a dotted line indicates a part which is to be bent at substantially ninety degrees.

Referring to FIG. 10, the front surface side sub frame part 42 is formed from a piece of plate having a substantially rectangular configuration by sheet metal press working. That is, the front surface side sub frame part 42 is formed by cutting four corner parts having substantially configurations and located at four corners of the plate, by cutting a part having a substantially rectangular configuration and situated at a substantially square center part of the plate so that an external edge part is formed, by obliquely cutting out corner parts of the external edge part, by cutting out the part situated at the substantially center part of the plate so as to form the rectangular hole forming part 65 having a substantially rectangular configuration, and by further bending the plate. More specifically, the front surface side sub frame part 42 (the back surface side sub frame part 44) includes a ceiling part 60, a floor part 61, side surface parts 62, a front surface part 64, and the others.

In FIG. 10, the ceiling part 60 and the floor part 61 are formed by bending at approximately 90 degrees from a state shown in FIG. 10. Similarly, the side surface parts 62 are also formed by bending at approximately 90 degrees from a state shown in FIG. 10. The widths of the ceiling part 60 and the floor part 61, namely lengths in the $Z_1$–$Z_2$ direction in FIG. 10, and the width of the side surface parts 62, namely a length in the $X_1$–$X_2$ direction in FIG. 10, are set as a length $l_4$.

As described above, the rectangular hole forming part 65 is provided at the substantially center part of the front surface part 64. The front surface part 64 is provided at a front surface side ($Y_2$ side in FIG. 9). The front surface part 64 has a width (a length in the $X_1$–$X_2$ direction in FIG. 9 and FIG. 10) having a length $l_2$. As described below, when the front surface side sub frame part 42 is fit-inserted to the front surface side main frame part 41, the front surface part 64 of the front surface side sub frame part 42 comes in contact with the circumference edge part 54-3 (See. FIG. 7 and FIG. 8) of the above mentioned front surface side main frame part 41.

Connection parts 60-1, 61-1, and 62-1 are formed by further bending the ceiling part 60, the floor part 61, and the side surface parts 62 at approximately 90 degrees from a part alienated by a length L from the external edge of the ceiling part 60, the floor part 61, and the side surface parts 62, so as to be parallel to the above mentioned front surface part 64. As described below, when the front surface side sub frame part 42 is fit-inserted to the front surface side main frame part 41, the connection parts 60-1, 61-1, and 62-1 of the front surface side sub frame part 42 come in contact with the connection part 54-4 of the above mentioned front surface side main frame part 41.

Furthermore, a plurality of first rivet installing hole forming parts 35-2 are formed in vicinities of four corners of the front surface part 64 and parts near the above vicinities of the ceiling part 60, the floor part 61, and the side face parts 62. A plurality of the first rivets 35 shown in FIG. 6 can be fit-inserted to the first rivet installing hole forming parts 35-1. Similarly, a plurality of the first rivet installing hole forming parts 35-2 are formed at a substantially center part in a height direction ($Z_1$–$Z_2$ direction of FIG. 10) of the front surface part 64.

Next, assembling steps of the rack structure body 30 by the front surface side main frame part 41 (the back surface side main frame part 43), the front surface side sub frame part 42 (the back surface side sub frame part 44), and four of the frame body connection parts 33, are explained.

FIG. 11 is a view for explaining the assembling steps of the rack structure body 30. FIG. 12 is a cross-sectional view of a part circled by a dotted line and taken along a line A—A shown in FIG. 11. In FIG. 12, for convenience to see and understand, illustrations of the first rivet installing hole forming parts 35-1 and 35-2 and the second rivet installing hole forming parts 36-1 and 36-2 are omitted.

First of all, as shown in FIGS. 11A and 11B, the back surface side sub frame part 44 is fit-inserted to the back surface side main frame part 43. More particularly, as shown in FIGS. 12A and 12B, the back surface side sub frame part 44 is fit-inserted to the back surface side main frame part 43 in the direction shown by an arrow B in FIG. 12A, by making the side surface part 62 of the back surface side sub frame part 44 be aligned with the side surface part 52 of the back surface side main frame part 43, until the front surface part 64 of the back surface side sub frame part 44 comes in contact with the circumference edge part 54-3 of the back surface side main frame part 43. The width L of the circumference edge part 54-3 of the back surface side main frame body 43 in the $X_1$–$X_2$ direction of FIG. 8 is set so as to be slightly longer than the sum of the length $l_1$ of the connection part 54-4 of the back surface side main frame body 43 in the $X_1$–$X_2$ direction of FIG. 8, and the length $l_2$ of the front surface part 64 of the back surface side sub frame body 44 in the $X_1$–$X_2$ direction of FIG. 10. Hence, it is possible to smoothly fit-insert the back surface side sub frame body 44 to the back surface side main frame body 43.

Furthermore, the width of the guide part 54-2 of the back surface side main frame part 43, namely length $l_3$ in the $X_1$–$X_2$ direction in FIG. 8 is set as to be substantially equal to the width of the right side surface part 62 and left side surface part 63 of the back surface side sub frame part 44, namely length $l_4$ in the $X_1$–$X_2$ direction in FIG. 10. Accordingly, as shown in FIG. 12B, when the front surface part 64 of the back surface side sub frame part 44 comes in contact with the circumference edge part 54-3 of the back surface side main frame part 43, the contact part 60-1 of the back surface side sub frame part 44 comes in contact with the contact part 54-4 of the back surface side main frame part 43.

Next, the first rivet 35 is fit-inserted to the back surface side main frame part 43 and the back surface side sub frame part 44, so that the back surface side main frame part 43 is inserted and fixed to the back surface side sub frame part 44. This situation is shown in FIG. 12B.

As a result of this, a hollow structure wherein there is a hollow in $Z_1$–$Z_2$ direction in FIG. 10 is formed at the side surface part 52 of the side surface side main frame part 43 by the guide part 54-2 and circumference edge part 54-3 of the-back surface side main frame part 43 and the contact part 60-1 and the side surface part 62 of the back surface side sub frame part 44, so that the back surface side sub-frame part 44 supports the back surface side main frame part 43 structurally.

Next, as shown in FIG. 11C and FIG. 12C, the frame body connection members 33 is installed to the back surface side main frame part 43. More particularly, the frame body connection member 33 is inserted in the direction shown by an arrow C in FIG. 12B. And then, the second rivet 36 is fit-inserted to the back surface side main frame part 43 and the frame body connection members 33, so that the frame body connection member 33 is installed and fixed to the back surface side main frame part 43.

Thus, the back surface side sub frame part 44 and the frame body connection member 33 are installed to the back surface side main frame part 43. As described above, the front surface side main frame part 41 and the front surface side sub frame part 42 have same structure as the back surface side main frame part 43 and the back surface side sub frame part 44. Hence, the front surface side sub frame part 42 and the frame body connection member 33 are installed to the front surface side main frame part 41 by the same steps so that the rack structure body 30 is assembled.

In the above embodiment, the first rivet 35 is used for fixing the back surface side sub frame part 44 to the back surface side main frame part 43. However, as long as the hollow structure is formed at the side surface part 52 of the back surface side main frame part 43, another connection member such as a screw may be used for fixing the back surface side sub frame part 44 to the back surface side main frame part 43. Similarly, instead of the second rivet 36, another connection member such as a screw may be used.

Thus, in this embodiment, the front surface side main frame part 41 (the back surface side main frame part 43) and the front surface side sub frame part 42 (the back surface side sub frame part 44) are formed by sheet metal press working, and the front surface side sub frame part 42 (the back surface side sub frame part 44) is fit inserted inside of the front surface side main frame part 41 (the back surface side main frame part 43), so that the front surface side frame body 41 (the back surface side frame body 43) is formed and a hollow structure is formed inside the front surface side main frame part 41 (the back surface side main frame part 43).

Because of the above mentioned hollow structure, inventors of this patent application found that higher strength of the rack structure body, that is the geometric moment of inertia in the X direction being approximately 2.3 times as large as the related art rack structure body 11 and the geometric moment of inertia in the Z direction being approximately 1.4 times as large as the related art rack structure body 11, is realized, in a case where the width L (the length in $X_1$–$X_2$ direction in FIG. 5) of the circumference edge part 54-3 provided at the front surface side (the $Y_2$ direction side in FIG. 5) of the front surface side main frame part of the rack structure body 30 of the present invention is set so as to be equal to the width L (the length in $X_1$–$X_2$ direction in FIG. 2) of the front surface side frame body 23 provided at the front surface side (the $Y_2$ direction side in FIG. 2) of the related art rack structure body 11 shown in FIG. 2, and the rack structure body 30 of the present invention has the substantially same volume as the related art rack structure body 11 shown in FIG. 2, for example.

Therefore, it is possible to make widths of the rack structure body 30 of the present invention thin because of the above mentioned structure. For example, although the related art frame structure body 11 has a weight of approximately 45 [kg], the frame structure body 30 of the present invention has a weight of approximately 42.5 [kg], and therefore it is possible to realize a weight reduction of approximately 5.5 [%].

Furthermore, although the related art frame structure body 11 has a displacement value of approximately 28 [mm] in the $X_1$–$X_2$ direction in FIG. 2 due to vibration, the frame structure body 30 of the present invention has a displacement value of approximately 22 [mm] in the $X_1$–$X_2$ direction in FIG. 5 due to vibration, and therefore it is possible to realize a reduction of structural displacement of approximately 23 [%].

In addition, although the related art frame structure body 11 has a characteristic frequency of approximately 6.5 [Hz], the frame structure body 30 of the present invention has a characteristic frequency of approximately 7.7 [Hz], and therefore it is possible to realize an improved characteristic frequency.

Furthermore, according to the structure of the rack structure body 30 of this embodiment, it is possible to improve the high strength, without making the width L (the length in $X_1$–$X_2$ direction in FIG. 5) of the circumference edge part 54-3 provided at the front surface side (the $Y_2$ direction side in FIG. 5) of the front surface side main frame part 41 long, that is, weight making frontage for installing the shelf 12 provided inside of the rack structure body 30 narrow, and without welding so as to avoid the stress concentration.

Furthermore, in this embodiment, it is possible to manufacture the front surface side frame body 31, the back surface side frame body 32 and the four frame body connection members 33, which form the rack structure body 30, by sheet metal press working without welding. Therefore, it is possible to avoid the generation of heat stress due to welding. Hence, it is possible to realize improvement of assembling measurement of the rack structure body 30.

It is necessary to provide the installation hole forming part at the rack structure body in order to install the electronic apparatus or the like such as the shelf inside of the rack structure body by using screws. In the related art rack structure body 11 shown in FIG. 2, the locations of the installation hole forming parts are decided by location tolerances of the hole forming parts for the parts based on the assembling measurements of the ceiling part frame body 21 and the floor part frame body 22, the two front surface side frame bodies 23, and the two back surface side frame bodies 24 which are main parts of the rack structure body 11.

On the other hand, in the rack structure body 30 of the present invention, the locations of the installation hole forming parts are decided by location tolerances of the installation hole forming parts at the time of manufacturing the front surface side frame body 31, the back surface side frame body 32, and the four frame body connection members 33 which are main parts of the rack structure body 30. This is because the front surface side frame body 31, the back surface side frame body 32, and the four frame body connection members 33 are integrally manufactured by sheet metal press working. Therefore, it is possible to improve the measurement precision of the location measurement in a case where the electronic apparatus or the like such as the shelf is installed inside of the rack structure body.

In addition, it is possible to manufacture the front surface side frame body 31, the back surface side frame body 32 and the four frame body connection members 33, which form the rack structure body 30, by sheet metal press working without welding. Therefore, the rack structure body 30 can be assembled without providing joints or steps so that the outside appearance of the rack structure body 30 can be unblemished.

Furthermore, as described above, the first rivet 35 is used as a connection member for fixing the back surface side sub frame part 44 to the back surface side main frame part 43. The second rivet 36 is used as a connection member for fixing the frame body connection member 33 to the back surface side main frame part 43. Hence, unlike the-related art rack structure body 11 shown in FIG. 2, it is not necessary to apply welding. Therefore, time for assembling the rack structure body 30 can be reduced as compared to the time in a case where welding is used for fixing. Also, cost for assembling the rack structure body 30 can be reduced. Hence, it is possible to accomplish improved assembling. In addition, for assembling the rack structure body 30, it is possible to prevent generating position gaps so that it is possible to assemble the rack structure body with high measurement precision. Furthermore, since the rivet are used, as compared with screws, for example, it is possible to install the front surface side main frame body 41 (the back surface side main frame part 43), the front surface side sub frame part 42 (the back surface side sub frame part 44) and the frame body connection parts 33, without damaging the outside appearance.

Furthermore, it is possible to realize the use of common parts for manufacturing the front surface side main frame body 41, the back surface side main frame part 43, the front surface side sub frame part 42, and the back surface side sub frame part 44, by making the positions of the first rivet hole forming parts 35-1 and 35-2 and the second rivet hole forming parts 36-1 formed at the front surface side main frame body 41, the back surface side main frame part 43, the front surface side sub frame part 42, and the back surface side sub frame part 44 symmetrical against the center of the rack structure body 30 along the X axis, Y axis and Z axis.

In addition, since the four frame body connection members 33 have the same structures, it is possible to use common parts. Therefore, it is possible to easily manage the frame body connection members 33, the front surface side main frame body 41, the back surface side main frame part 43, the front surface side sub frame part 42, the back surface side sub frame part 44. Hence, the necessary number of units produced per lot is increased so that it is possible to reduce the unit manufacturing cost.

In the above mentioned embodiment, the front surface side sub frame part 42 (the back surface side sub frame part 44) which functions as a support member of the front surface side main frame body 41 (the back surface side main frame part 43), is fit-inserted to the front surface side main frame body 41. (the back surface side main frame part 43), so that the rack structure body 30 is assembled. However, if high strength is not required such that there is a reserve regarding the strength of the rack structure body for the machine, it is possible to easily form the rack structure body 30 by only the front surface side main frame body 41 (the back surface side main frame part 43) and the frame connection members 33, but without fit inserting the front surface side sub frame part 42 (the back surface side sub frame part 44) to the front surface side main frame body 41 (the back surface side main frame part 43). In this case, since the front surface side sub frame part 42 (the back surface side sub frame part 44) is not used, it is possible to further reduce the weight of the frame structure body 30.

Next, a second embodiment of the present invention is explained. Parts that are the same as the parts in the first embodiment are given the same reference numerals, and explanation thereof is omitted.

Figure 14:
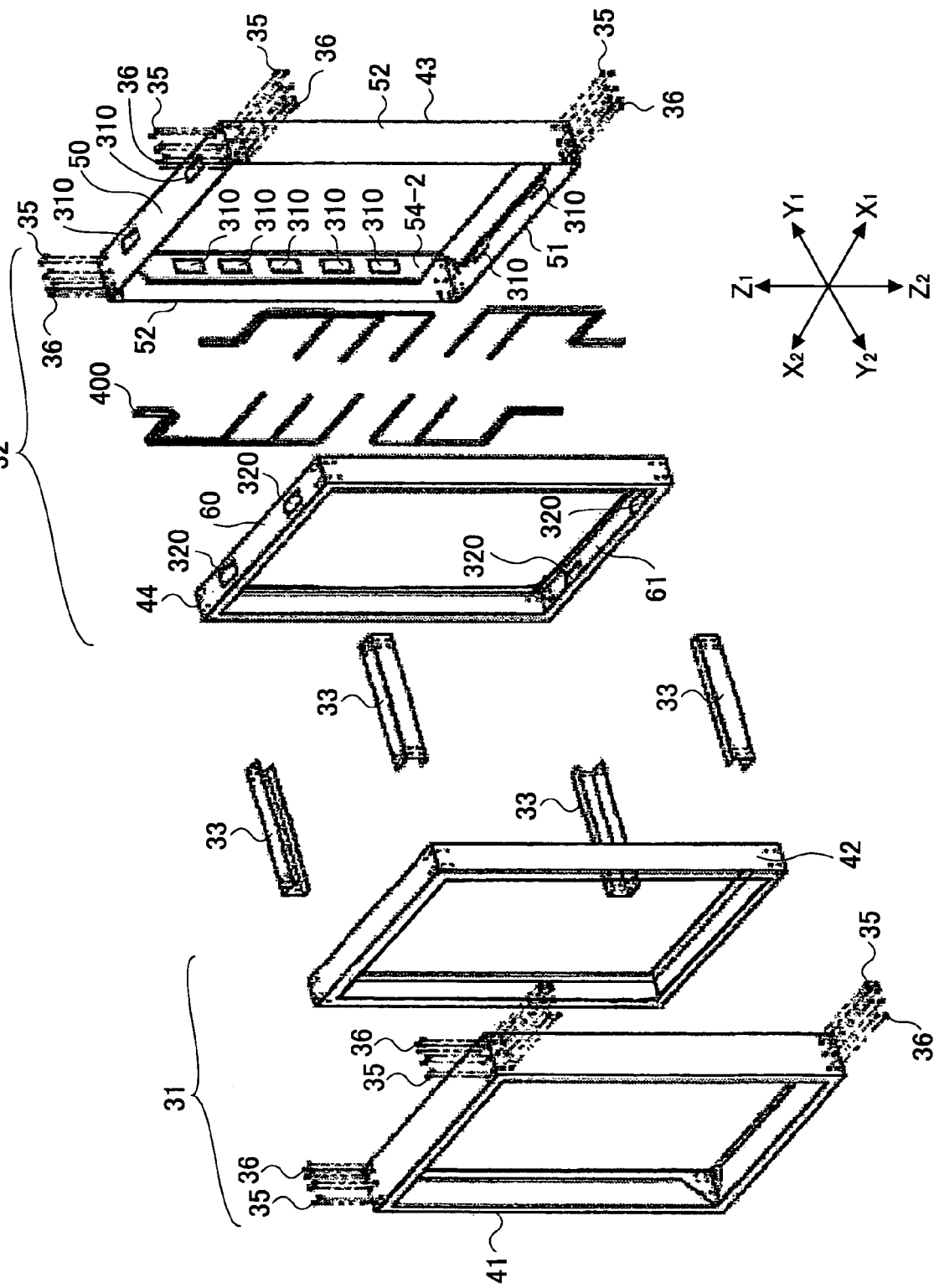
FIG. 14 is an exploded perspective view showing a structure of the rack structure body 300.

FIG. 13 is a perspective view of the rack structure body 300 of the second embodiment of the present invention. FIG. 14 is an exploded perspective view showing the structure of the rack structure body 300.

As shown in FIG. 13, the rack structure body 300 of the second embodiment of the present invention, as well as the rack structure body 40 of the first embodiment, include the front surface side frame part 31, the back surface side frame part 32, four of the frame body connection members 33, and others.

As shown in FIG. 14, the front surface side frame part 31 includes the front surface side main frame part 41 and the front surface side sub frame part 42. The front surface side main frame part 41 forms an external form part of the front surface side frame part 31. The front surface side sub frame part 42 is installed inside of the front surface side main frame part 41 so that a hollow structure is formed inside of the front surface side main frame part 41. The front surface side sub frame part 42 reinforces and supports the front surface side main frame part 41. The front surface side main frame part 41 and the front surface side sub frame part 42 are integrally formed by bending with sheet metal press working. Similarly, the back surface side frame part 32 includes the back surface side main frame part 43 and the back surface side sub frame part 44. The back surface side sub frame part 44 is installed inside of the back surface side main frame part 43 so that a hollow structure is formed. The back surface side sub frame part 44 reinforces and supports the back surface side main frame part 43. The back surface side main frame part 43 and the back surface side sub frame part 44 are integrally formed by bending with sheet metal press working respectively.

Referring to FIG. 14, in the rack structure body 300 of the second embodiment, unlike the rack structure body 30 of the first embodiment, a plurality of hole forming parts 310 for wiring which are piercing holes and have substantially rectangular configurations are formed in a line in the $X_1$–$X_2$ direction at the ceiling part 50 and the floor part 51 of the back surface side main frame part 43 and in the $Z_1$–$Z_2$ direction at a guide part 54-2.

Furthermore, a plurality of hole forming parts 320 for wiring which are piercing holes and have substantially rectangular configurations are formed in a line in the $X_1$–$X_2$ direction at positions of the ceiling part 60 and the floor part 61 of the back surface side main frame part 44. The hole positions are overlapped when the back surface side sub frame part 44 is inserted to the back surface side main frame part 43. Therefore, when the back surface side sub frame part 44 is fit-inserted to the back surface side main frame part 43, the hole forming parts 310 for wiring of the back surface side main frame part 43 and the hole forming parts 320 for wiring of the back surface side sub frame part 44 go through.

In addition, a wiring cable 400 which is a wiring member is provided at a hollow part which is formed by fit-inserting the back surface side sub frame part 44 to the back surface side main frame part 43 and has a hollow configuration in the $Z_1$–$Z_2$ direction of the side surface parts 52 of the back surface side main frame part 43. The wiring cable is provided so that the hole forming parts 310 for wiring of the back surface side main frame part 43 and the hole forming parts 320 for wiring of the back surface side sub frame part 44 go through. As shown in FIG. 13, the wiring cable extends from the hole forming parts 310 for wiring of the back surface side main frame part 43.

Under this structure, the wiring cable 400 is hidden and supported at the hollow part which is formed by fit-inserting the back surface side sub frame part 44 to the back surface side main frame part 43, and has a hollow configuration in the $Z_1$–$Z_2$ direction of the side surface parts 52 of the back surface side main frame part 43. Hence, it is not necessary to separately provide members for supporting and fixing the wiring cable 400. In addition, the wiring cable 400 is supported and fixed without blemishing to the external appearance of the rack structure body 300. Also, even if a vibration such as caused by an earthquake occurs, for example, the wiring cable 400 can be prevented from being propelled out from the inside of the rack structure body 300.

Also, it is possible to extend the wiring cable 400 from the hole forming parts 310 for wiring of the back surface side main frame part 43 to every shelf, by forming a number of the hole forming parts 310 for wiring at the guide part 54-2 of the back surface side main frame part 43 corresponding to the number of the shelves-provided for the rack structure body 300.

In addition, although configurations of the hole forming parts 310 for wiring of the back surface side main frame part 43 and the hole forming parts 320 for wiring of the back surface side sub frame part 44 are set as substantially rectangular configurations in the above mentioned embodiment, the present invention is not limited to this. That is, the configurations and sizes of the hole forming parts 310 for wiring of the back surface side main frame part 43 and the hole forming parts 320 for wiring of the back surface side sub frame part 44 are set so as to correspond to configurations and sizes of connection members such as a connector provided at the end part of the wiring cable 400.

As described above, since the back surface side main frame part 43 and the back surface side sub frame part 44 are integrally formed by sheet metal press working, it is possible to form the hole forming parts 310 for wiring and the hole forming parts 320 for wiring before a designated plate member is bent. Therefore, it is possible to form the hole forming parts 310 for wiring and the hole forming parts 320 having desirable configurations and sizes at the back surface side main frame part 43 and the back surface side sub frame part 44 with high measurement precision.

Furthermore, in the above embodiment, the hole forming parts 310 are formed at the back surface side main frame part 43 and the hole forming parts 320 are formed at the back surface side sub frame part 44. However, the present invention is not limited to the above. Rather, the hole forming parts 310 may be formed at the front surface side main frame part 41 and the hole forming parts 320 may be formed at the front surface side sub frame part 42.

The present invention is not limited to these embodiments, but variations and modifications may be made without departing from the scope of the present invention.

For example, although the rack structure body used for a communication apparatus is explained, the present invention can be applied to not only the rack structure body used for a communication apparatus but also a rack structure body used for an electronic machine such as a computer, calculation machine, or the like, an apparatus for supplying electric power supply apparatus to the communication apparatus and the electronic machine (for example, an electric power where a battery for arc welding is installed).

This patent application is based on Japanese priority patent application No. 2003-083474 filed on Mar. 25, 2003, the entire contents of which are hereby incorporated by reference.

What is claimed is:

1. A rack structure body for a machine, comprising
  a frame body provided at one of a front surface side and a back surface side of the rack structure body, wherein
  the frame body includes a main frame part formed by bending and a sub frame part formed by bending,
  the sub frame part is installed inside of the main frame part,
  the frame body has a hollow structure, and
  a bent part of the sub frame part comes in contact with a bent part of the main frame part, so that the sub frame part reinforces and supports the main frame part.

2. The rack structure body for a machine as claimed in claim 1,
  wherein one of the main frame part and the sub frame part is integrally formed by bending with sheet metal press working.

3. The rack structure body for a machine as claimed in claim 1, wherein
  the main frame part and the sub frame part have rectangular shape configurations,
  the frame bodies provided at the front surface side and the back surface side are connected by a plurality of frame body connection members provided at four corners of the rack structure body, and
  the frame body connection members are installed inside of the main frame part.

4. The rack structure body for a machine as claimed in claim 1,
  wherein the main frame part and the sub frame part which is installed inside of the main frame part are fixed by a first fixing member.

5. The rack structure body for a machine as claimed in claim 4,
  wherein the first fixing member is a rivet.

6. The rack structure body for a machine as claimed in claim 1, wherein
  frame bodies provided at the front surface side and the back surface sides are connected by a frame body connection member, and
  the frame bodies and the frame body connection member are fixed by a second fixing member.

7. The rack structure body for a machine as claimed in claim 6,
  wherein the frame body connection member is integrally formed by bending with sheet metal press working.

8. The rack structure body for a machine as claimed in claim 6,
  wherein the second fixing member is a rivet.

9. The rack structure body for a machine as claimed in claim 1, wherein
  a hole forming part for electrical wiring is formed at the frame body,
  the frame body has a horizontal cross section which is a hollow plane surface, and
  the electrical wiring is provided inside of the frame body and extends from the hole forming part.

10. A rack structure body for a machine, comprising:
  a frame body provided at one of a side and an opposite side of the rack structure body, wherein
  the frame body includes a main frame part formed having a quadrangular shape configuration and a sub frame part having a quadrangular shape configuration, and
  the sub frame part is installed inside of the main frame part.

* * * * *